(12) United States Patent
Ijitsu

(10) Patent No.: US 8,000,157 B2
(45) Date of Patent: Aug. 16, 2011

(54) RAM MACRO AND TIMING GENERATING CIRCUIT THEREOF

(75) Inventor: Kenji Ijitsu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 469 days.

(21) Appl. No.: 12/198,373

(22) Filed: Aug. 26, 2008

(65) Prior Publication Data

US 2009/0059713 A1   Mar. 5, 2009

Related U.S. Application Data

(63) Continuation of application No. PCT/JP2006/303656, filed on Feb. 28, 2006.

(51) Int. Cl.
*G11C 7/00* (2006.01)

(52) U.S. Cl. ............ 365/191; 365/201; 365/233.1

(58) Field of Classification Search .......... 365/191, 365/201, 223.1
See application file for complete search history.

(56) References Cited

U.S. PATENT DOCUMENTS

| | | | |
|---|---|---|---|
| 4,608,669 A * | 8/1986 | Klara et al. ............ | 365/201 |
| 4,916,670 A | 4/1990 | Suzuki et al. | |
| 5,226,011 A | 7/1993 | Yanagisawa | |
| 5,576,996 A | 11/1996 | Awaya et al. | |
| 5,764,592 A | 6/1998 | McClure | |
| 5,910,181 A * | 6/1999 | Hatakenaka et al. ....... | 714/718 |
| 5,973,990 A | 10/1999 | Sakurai | |
| 6,643,807 B1 * | 11/2003 | Heaslip et al. ............ | 714/719 |
| 6,757,212 B2 * | 6/2004 | Hamamoto et al. ...... | 365/233.11 |
| 6,829,728 B2 * | 12/2004 | Cheng et al. ............ | 714/30 |
| 2001/0033519 A1 | 10/2001 | Koshikawa | |
| 2004/0260975 A1 | 12/2004 | Nagura | |
| 2005/0117422 A1 | 6/2005 | Urayama et al. | |

FOREIGN PATENT DOCUMENTS

| | | |
|---|---|---|
| JP | 01-196790 | 8/1989 |
| JP | 02-089300 | 3/1990 |
| JP | 03-230395 | 10/1991 |
| JP | 04-134695 | 5/1992 |
| JP | 07-29375 | 1/1995 |
| JP | 08-083498 | 3/1996 |
| JP | 10-233099 | 9/1998 |
| JP | 11-144497 | 5/1999 |
| JP | 2001-243800 | 9/2001 |

(Continued)

OTHER PUBLICATIONS

European Search Report mailed May 13, 2009 and issued in corresponding European Patent Application 06714793.4.

(Continued)

*Primary Examiner* — Alexander Sofocleous
(74) *Attorney, Agent, or Firm* — Staas & Halsey LLP

(57) ABSTRACT

A timing generating circuit generates a control clock (1) and a test clock (2) based on an externally input clock CLK, and outputs the generated clocks to a testing circuit. The control clock (1) is a signal the phase of which is delayed by a predetermined amount with reference to the clock CLK. This predetermined amount can be set/changed with an external test signal. The test clock (2) is nearly an inversion signal of the clock CLK. The testing circuit generates various types of control signals (4) based on either of the clocks (1) and (2), and distributes the signals to a controlling circuit. Which of the clocks (1) and (2) is selected in the testing circuit can be set with an external test signal.

11 Claims, 10 Drawing Sheets

FOREIGN PATENT DOCUMENTS

| | | |
|---|---|---|
| JP | 2001-307499 | 11/2001 |
| JP | 2002-42466 | 2/2002 |
| JP | 2004-22014 | 1/2004 |
| JP | 2004-158144 | 6/2004 |
| JP | 2005-141817 | 6/2005 |
| JP | 2005-235364 | 9/2005 |

OTHER PUBLICATIONS

International Search Report issued Oct. 24, 2006 in corresponding PCT/JP2006/303656.

Japanese Office Action issued on Mar. 29, 2011 in related Japanese Patent Application No. 2008-502566.

* cited by examiner

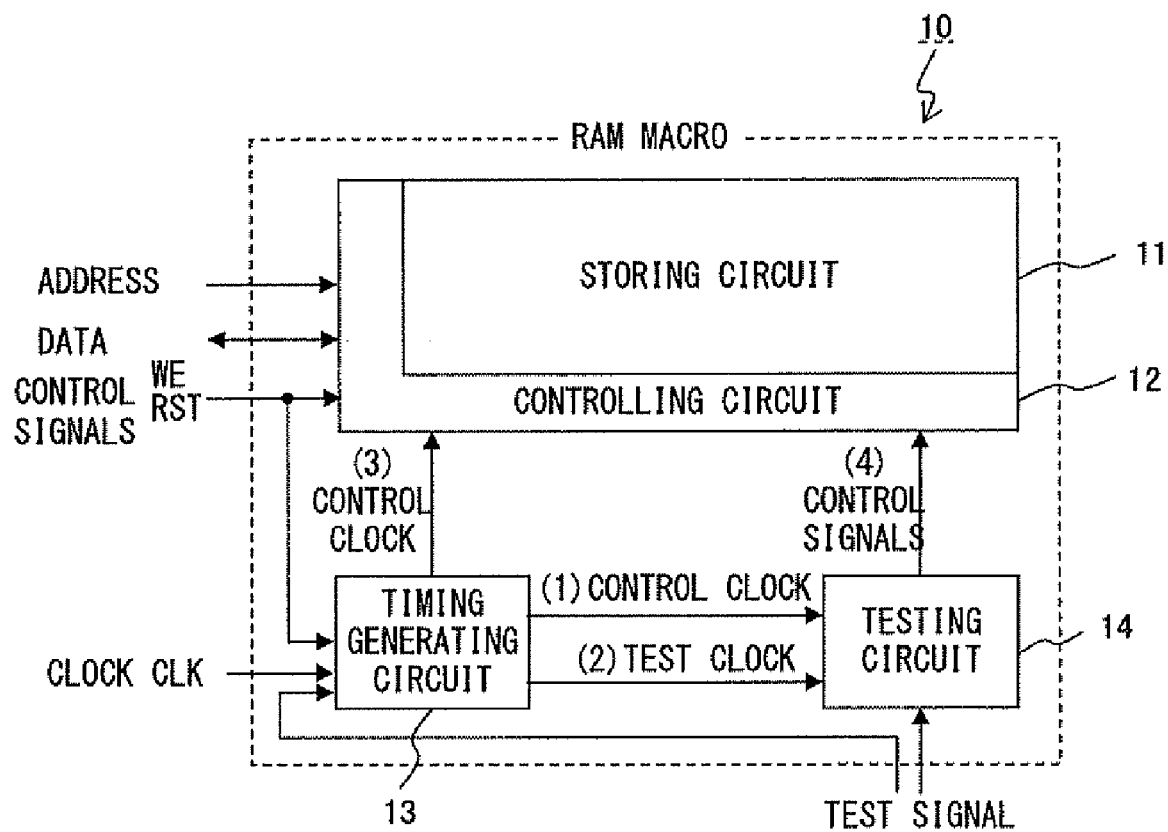
F I G. 1

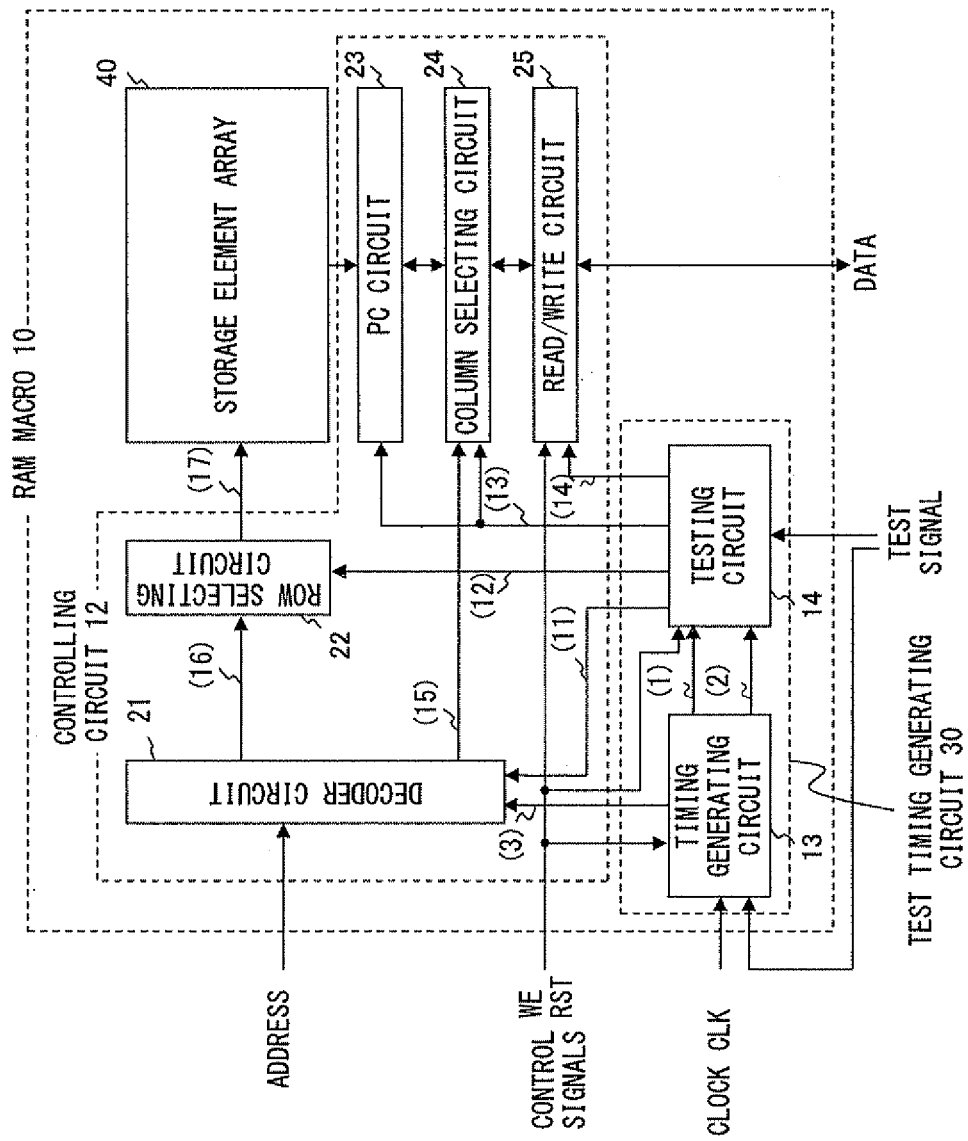
F I G. 2

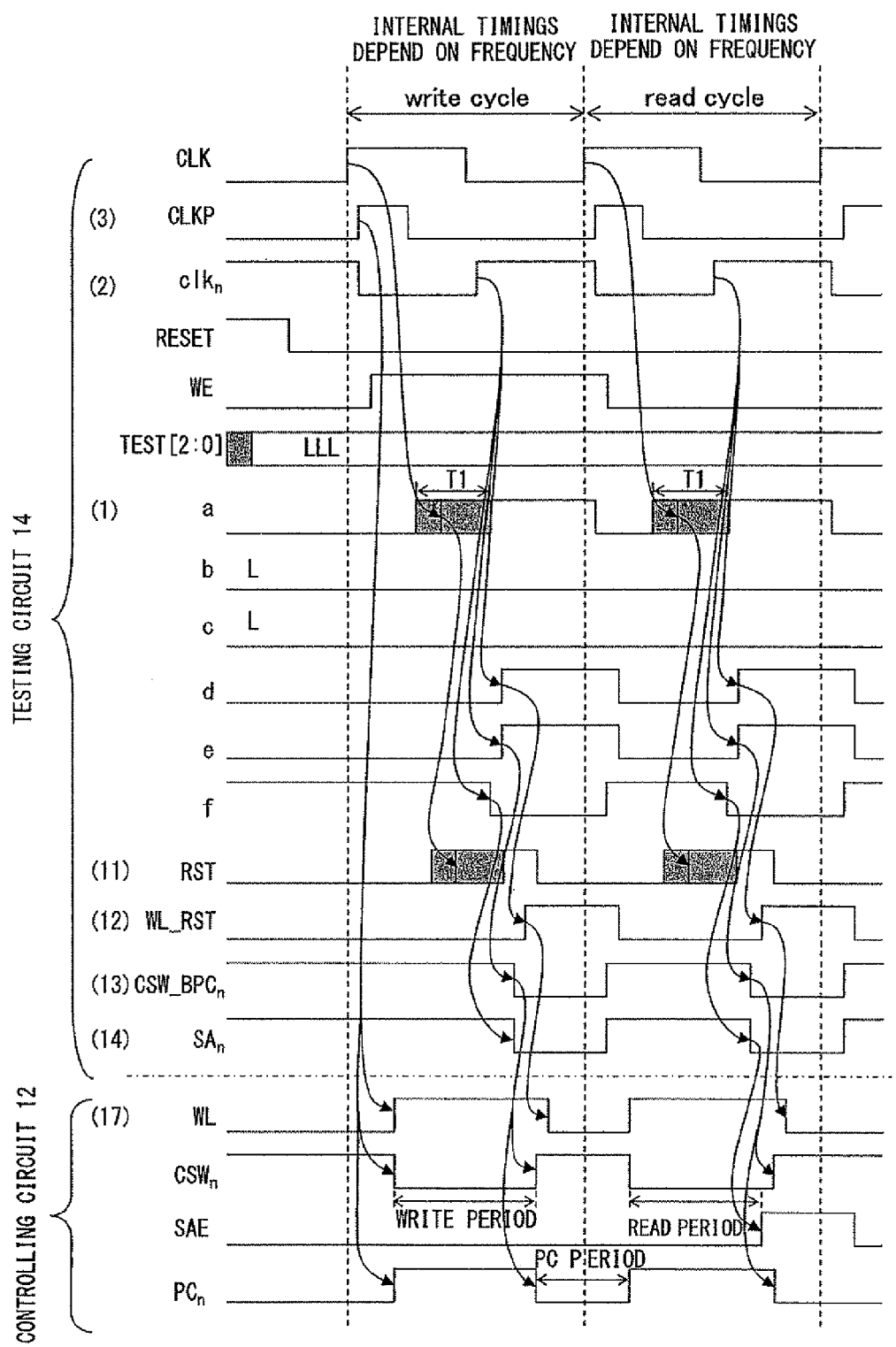
F I G. 4

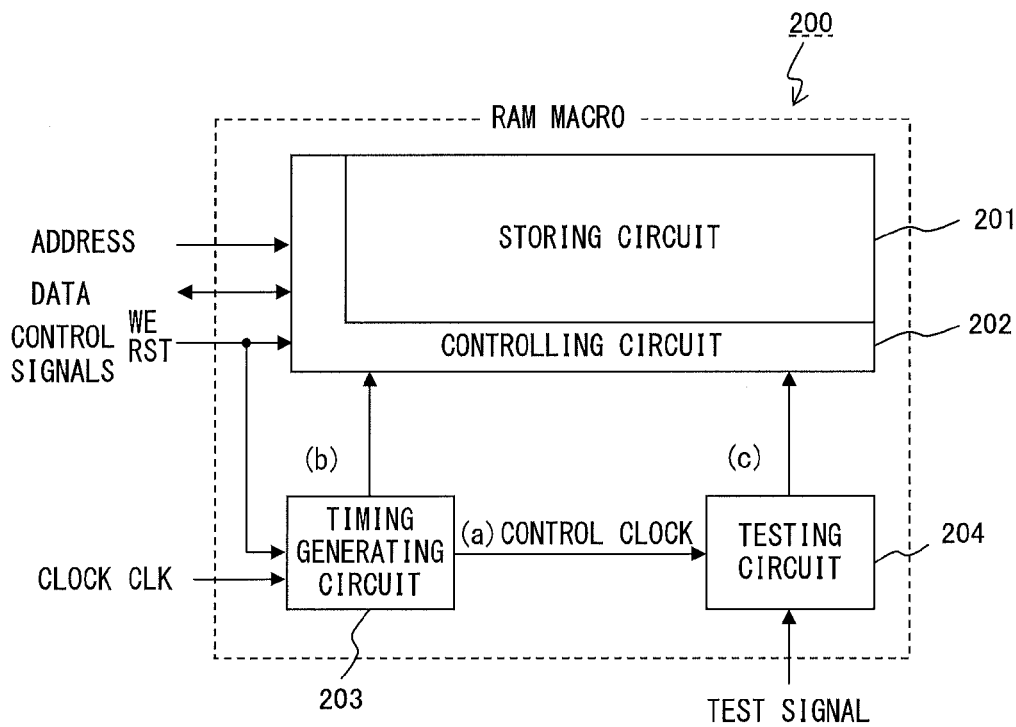
F I G. 1 0 A
PRIOR ART
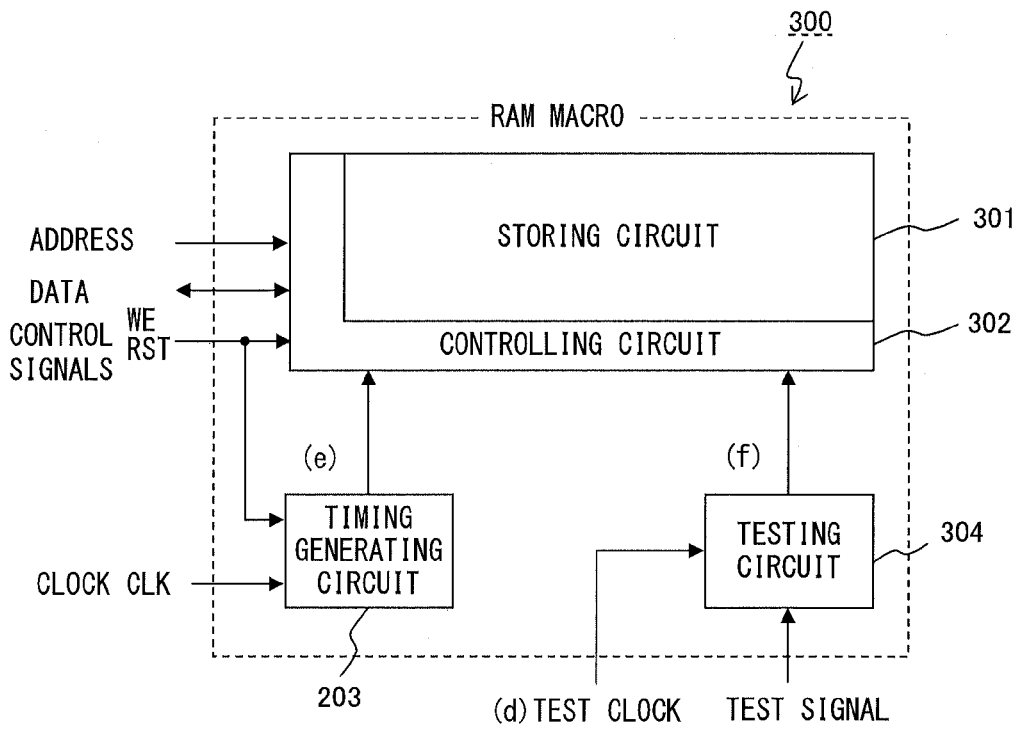
F I G. 1 0 B
PRIOR ART

US 8,000,157 B2

RAM MACRO AND TIMING GENERATING CIRCUIT THEREOF

CROSS REFERENCE TO RELATED APPLICATION

This application is a continuation of PCT application of PCT/JP2006/303656, which was filed on Feb. 28, 2006.

BACKGROUND OF THE INVENTION

1. Field of the Invention

The present invention relates to a timing generating circuit included in a RAM macro, and a RAM macro including the timing generating circuit.

2. Description of the Related Art

Conventionally, there are testing circuits for testing a RAM macro as disclosed, for example, by Patent Documents 1, 2, etc.

According to the invention disclosed by Patent Document 1, a fault of a memory cell is determined by causing access operations to be performed within a RAM at high speed with the use of an n-multiple (n is a real number) clock signal, which is generated by multiplying an externally input clock signal by n within a chip, as a clock signal for synchronizing operations within the RAM, and by making a comparison with an expected value only once at the end of one cycle of the externally input clock. Namely, whether or not the data itself of a RAM cell is changed by the influences of sequential accesses is evaluated with one pattern not by making a comparison with an expected value for each clock cycle, but by inputting a high-speed clock to either of X and Y sides and causing the sequential access operations to be performed.

Additionally, according to the invention disclosed by Patent Document 2, a command generating unit outputs a test clock generation signal if an instruction of a program for testing a memory is a test clock generation instruction. A timing test clock generating unit generates a test clock based on a timing margin clock with a phase different from a master clock, and the test cock generation signal. A timing test controlling circuit tests the memory by generating a signal for controlling the timing of the memory based on the master clock and the test clock.

Furthermore, not only a testing circuit where operation timings are determined based on an externally input clock CLK but also a testing circuit where operation timings are determined based on a clock other than a clock CLK is conventionally known as the above described testing circuit.

FIGS. 10A and 10B show examples of configurations of such conventional techniques.

A RAM macro 200 shown in FIG. 10A comprises a storing circuit 201, a controlling circuit 202, a timing generating circuit 203, and a testing circuit 204. The controlling circuit 202 performs various types of access operations to/from the storing circuit 201 based on externally input address, data, and various types of control signals, a signal (b) output from the timing generating circuit 203, and various types of control signals (c) output from the testing circuit 204 at the time of a test. The timings of various types of access operations are especially influenced by the operation timings of the various types of control signals (c) output from the testing circuit 204. In the configuration shown in FIG. 10A, the testing circuit 204 operates based on a control clock (a) output from the timing generating circuit 203. The control clock (a) is, for example, an n-multiple clock signal, etc. of a clock CLK.

A RAM macro 300 shown in FIG. 10B has only a difference from the configuration shown in FIG. 10A such that a test clock (d) that is a clock other than the clock CLK is externally input to the testing circuit 304, which operates based on the test clock (d).

With the conventional technique shown in FIG. 10A, the testing circuit generates the control timings of read and write operations from either of rising and falling timings of the externally input clock CLK, and cannot change only either of operation margins of the read and the write operations, leading to difficulties in identifying whether a fault is caused by either a read operation or a write operation.

Additionally, if the control timings of read and write operations are generated from the falling edge of the clock, a test must be conducted with high-frequency cycles in order to beforehand evaluate the margins of operations performed on high-frequency cycles equivalent to those on which the system is running. This requires a dedicated testing circuit to be separately embedded.

Furthermore, with the conventional technique shown in FIG. 10B, control signals (e) and (f) shown in this figure can be generated respectively from the timings of two types of clock signals by externally inputting the two types of clock signals (clock CLK and the test clock (d)). However, a circuit dedicated to the generation of the test clock (d) must be separately provided, and it becomes difficult to adjust the mutual timings of the two types of externally input clock signals. Therefore, it is desirable to enable fundamental timings of two systems or more with different timings to be generated based on a reference clock signal CLK within a RAM macro without using externally and separately generated clock signals.

Still further, the operation timings of various types of control signals output from the testing circuit cannot be conventionally changed to diverse timings with ease depending on a situation.

Patent Document 1: Japanese Published Unexamined Patent Application No. 2004-22014
Patent Document 2: Japanese Published Unexamined Patent Application No. 2004-158144

SUMMARY OF THE INVENTION

An object of the present invention is to provide a timing generating circuit that can make either of operation margins of read and write operations strict, can thereby identify whether a fault is caused by either a read operation or a write operation, or can easily change the operation timings of various types of control signals output from a testing circuit to diverse timings depending on a situation, and can easily make various evaluations, and a RAM macro including the timing generating circuit.

A RAM macro according to the present invention is a RAM macro that has a storing circuit and a controlling circuit accessing the storing circuit, and comprises a timing generating circuit for outputting a first control clock generated from the rising edge of an externally input clock, and a second control clock generated from the falling edge of the externally input clock, and a testing circuit, which is a circuit for outputting to the controlling circuit various types of control signals for determining various types of timings of accesses made by the controlling circuit to/from the storing circuit, and to which the first and the second control clocks are input and an evaluation mode selection signal is externally input, for determining the operation timings of the various types of control signals based on either of the first and the second control clocks according to the evaluation mode selection signal, wherein the operation timing of a control signal synchronous with the first control clock does not depend on the frequency of the externally input clock, and the operation timing of a control signal synchronous with the second control clock depends on the frequency of the externally input clock.

The evaluation mode selection signal is externally and arbitrarily set/changed in the RAM macro, whereby the various types of timings of accesses made by the controlling circuit to/from the storing circuit can be easily changed to diverse timings depending on a situation by the timing generating circuit and the testing circuit. The various types of access timings can be determined, for example, based on either of the first and the second control clocks. Alternatively, for example, some of the various types of access timings can be determined based on the first control clock, and the rest of the timings can be determined based on the second control clock. Moreover, the various types of access timings can be determined based on the first control clock on a write cycle, and can be determined based on the second control clock on a read cycle (or vice versa).

In the RAM macro having the above described configuration, the timing generating circuit comprises, for example, a delay pulse generating circuit, to which the externally input clock and an external delay value selection signal are input, and which outputs, as the first control clock, a signal generated by delaying the externally input clock according to the delay value selection signal, and the second control clock is implemented as an inversion signal of the externally input clock.

In this way, the various types of access timings determined based on the first control clock can be changed with some degree of arbitrariness by externally and arbitrarily setting/changing the delay value selection signal. Therefore, by way of example, an operation margin test, etc. can be easily conducted.

In the RAM macro having the above described configuration, for example, if the evaluation mode selection signal indicates a first operation mode, all of the operation timings of the various types of control signals are synchronous with the second control clock. If it is desired to make the various types of access timings depend on the frequency of the externally input clock (if it is desired to change the timings by altering the frequency of the externally input clock) depending on a situation, the operation mode 1 may be set.

Additionally, in the RAM macro having the above described configuration, the various types of control signals include, for example, a read/write control signal for determining write and read periods related to a read/write operation performed by the controlling circuit from/to the storing circuit, and if the evaluation mode selection signal indicates a second operation mode, the operation timing of the read/write control signal is synchronous with the first control clock on a write cycle, and synchronous with the second control clock on a read cycle.

If the second operation mode is set, the control timings of the read and the write operations are determined based on different control clocks. Therefore, only either of the operation margins of the read and the write operations can be changed. Accordingly, whether a fault is caused by either the read operation or the write operation can be easily identified.

Furthermore, in the RAM macro having the above described configuration, the various types of control signals include, for example, a first control signal that is a signal for invalidating a row selection signal issued from the controlling circuit to the storing circuit, and a second control signal for determining the start timing of a pre charge period, and if the evaluation mode selection signal indicates a third operation mode, the operation timing of the first control signal is synchronous with the second control clock, and the operation timing of the second control signal is synchronous with the first control clock.

If the third operation mode is set, the internal state of a memory cell can be made stricter than the normal operation (read/write operation while the system is running) state of the RAM macro. Namely, a state obtained by making a PC period and a WL selection period overlap can be made longer than a normal period.

Still further, in the RAM macro having the above described configuration, all of the operation timings of the various types of control signals are synchronous with the first control clock, for example, if the evaluation mode selection signal indicates a fourth operation mode. If it is not desired to make the various types of access timings depend on the frequency of the externally input clock depending on a situation, the operation mode 1 may be set. In this case, the various types of access timings can be changed by altering the setting of the delay value selection signal. Moreover, even if the frequency of the externally input clock becomes lower than a normal frequency due to some reason, the access timings do not depend on the frequency of the externally input clock as described above. Therefore, the RAM macro can be operated in a normal manner.

The present invention is not limited to the above described RAM macro, and can be configured as a circuit (test timing generating circuit) composed of the timing generating circuit and the testing circuit. Moreover, the present invention is not limited to the configuration for changing an operation mode, and can be implemented practically as a configuration fixed to any of the operation modes.

BRIEF DESCRIPTION OF THE DRAWINGS

FIG. 1 is a block diagram showing the outline of a configuration of a RAM macro according to a preferred embodiment;

FIG. 2 is a block diagram showing the details of a configuration of a controlling circuit of the RAM macro shown in FIG. 1;

FIG. 4 is an operation timing diagram in an operation mode 1 (falling edge function mode);

FIGS. 10A and 10B are block diagrams exemplifying configurations of conventional RAM macros.

DESCRIPTION OF THE PREFERRED EMBODIMENTS

Figure 3:
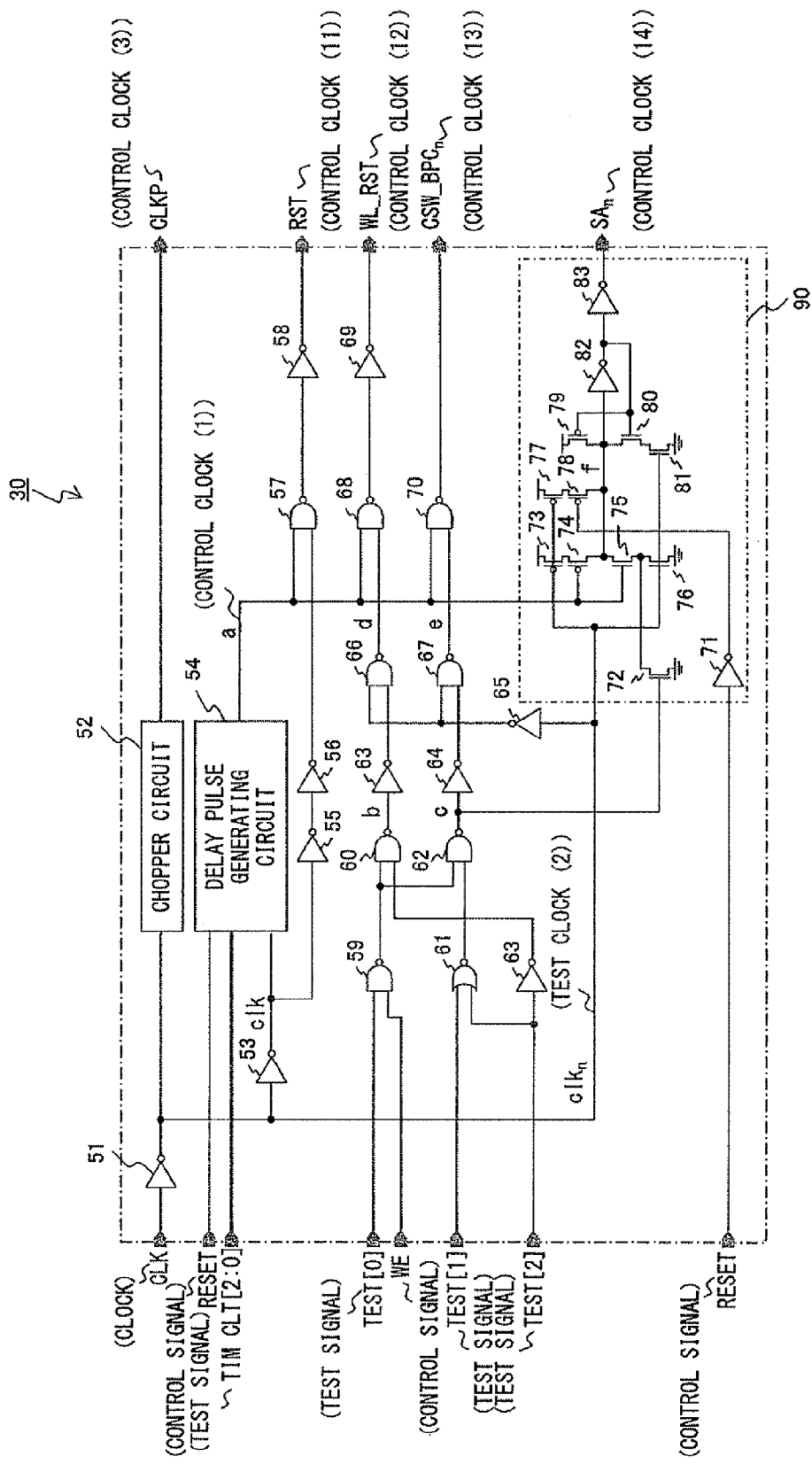
FIG. 3 is a circuit diagram showing the details of a test timing generating circuit of the RAM macro shown in FIG. 1.

A preferred embodiment according to the present invention is described below with reference to the drawings.

FIG. 1 shows the outline of the configuration of a RAM macro according to this preferred embodiment.

The RAM macro 10 shown in this figure comprises a storing circuit 11 composed of storage elements, a controlling circuit 12 for controlling the storing circuit 11, a timing generating circuit 13 for generating a timing based on an externally input clock CLK, and a testing circuit 14 for testing the storing circuit 11. A RAM of the RAM macro 10 according to this preferred embodiment is fundamentally an SRAM. However, the RAM may be a DRAM. However, in the case of the DRAM, a cell test period cannot be adjusted although write and read periods to be described later can be adjusted.

The timing generating circuit 13 generates a control clock (1) and a test clock (2) based on an externally input clock CLK, and outputs the generated clocks to the testing circuit 14 at the time of a normal operation or a test. The control clock (1) is a signal generated by delaying the phase of the clock CLK by a predetermined amount, which can be set/changed according to an external test signal. The test clock (2) nearly becomes a signal (the phase of which is delayed by approximately 180°) generated by inverting the clock CLK. In other words, the timing generating circuit 13 generates the control clock (1) from the rising edge of the clock CLK, and also generates the test clock (2) from the falling edge of the clock CLK (the rising edge of the control clock (1) is generated from the rising edge of the clock CLK and the rising edge of the test clock (2) is generated from the falling edge of the clock CLK). Note that the timing generating circuit 13 also generates a control clock (3) from the rising edge of the clock CLK similar to conventional technology.

The timing generating circuit 13 outputs the control clock (3) to the controlling circuit 12, and distributes the control clock (1) and the test clock (2) to the testing circuit 14. The control signal (4) does not indicate one control signal. Actually, the control signal (4) includes a plurality of control signals as shown in FIG. 2.

The testing circuit 14 generates each of the various types of control signals (4) based on either of the above described clocks (1) and (2), and distributes the generated signals to the controlling circuit 12.

The storing circuit 11 and the controlling circuit 12 themselves may be nearly similar to those of a conventional configuration. Namely, the controlling circuit 12 selects a corresponding memory cell within the storing circuit 11 according to an externally input address, and performs a data read/write operation from/to the storing circuit 11 based on the control clock (3) output from the timing generating circuit 13, and the various types of control signals (4) output from the testing circuit 14 (also control signals WE, RES, etc. are naturally input similar to conventional technology). At this time, the operation becomes more stable as the period of the read/write operation timing controlled by the controlling circuit 12 becomes longer. Inversely, the operation becomes more unstable as the period becomes shorter, leading to a higher possibility of causing an error of the read/write operation.

The RAM macro 10 according to this preferred embodiment is characterized in the timing generating circuit 13 and the testing circuit 14. Namely, the timing generating circuit 13 generates fundamental timings (1), (2), and (3) of two systems of more based on the input clock CLK to the RAM macro 10. Then, the timing generating circuit 13 outputs the control clock (3) to the controlling circuit 12, and also outputs the control clock (1) and the test clock (2) to the testing circuit 14. The important point in this preferred embodiment is the fundamental timings of two systems, namely, the control clock (1) and the test clock (2) output to the testing circuit 14, and the control clock (3) is not particularly described.

The testing circuit 14 generates each of the various types of control signals (4) based on either of the two systems of the fundamental timings (1) and (2) as described above. Namely, all of the control signals configuring the control signal (4) do not uniformly operate based on either of the two systems of the fundamental timings (1) and (2). Some of the control signal (4) may operate based on the control clock (1), and the rest of the control signal (4) may operate based on the test clock (2). Alternatively, a control signal may operate based on the control clock (1) on a write cycle or may operate based on the test clock (2) on a read cycle (inversely, the control signal may operate based on the control clock (1) on the read cycle, and may operate based on the test clock (2) on the write cycle) (namely, the control signal may operate in various types of operation modes such as operation modes 1 to 4 to be described later).

The various types of control signals (4) themselves may be nearly similar to those in conventional technology. With this technique, the operation timings of the various types of control signals (4) can be arbitrarily set/changed.

The above described various types of operation modes are switched according to the setting of a test signal that is externally input to the testing circuit 14.

As stated earlier, the controlling circuit 12 performs access operations to/from the storing circuit 11 based on the various types of control signals (4), and the like. Therefore, the above description means that the various types of control timings within the RAM macro 10 are determined based on either of the two systems of the fundamental timings (1) and (2). The RAM macro can be operated easily and arbitrarily in various operation modes according to an externally made setting as mentioned above, and various evaluations of the RAM macro can be made. This is one of characteristics of the present invention.

In this way, an operation mode can be switched according to a setting made externally to the RAM macro, and control timings with different operation timings can be generated. Moreover, the RAM macro can be evaluated by changing the timing margin of each operation with a change of the delay amount or the frequency of the input clock CLK.

For example, in the operation mode 2 to be described later, read and write operations can be controlled to operate at separate operation timings. Accordingly, read/write periods from/to the storing circuit 11 can be changed by altering the delay amount or the frequency of the externally input clock CLK, as will be described later (one of the read and the write periods can be made looser, and the other can be made stricter). Therefore, whether a fault is caused by either a read operation or a write operation can be identified. This is also one of the characteristics of the present invention.

Also at the time of a test conducted on a low-frequency cycle, the RAM macro 10 can be operated and evaluated at an internal operation timing equivalent to that used when the system is running by operating the RAM macro 10 based on the control clock (1).

FIGS. 2 and 3 are circuit diagrams showing the details of the configuration of the RAM macro 10.

FIG. 2 shows the details of the configuration of the controlling circuit 12. As described above, the controlling circuit 12 itself has the same configuration as that in the conventional technology. In FIG. 2, signals input from the testing circuit 14 to the controlling circuit 12, and the like are shown in detail by depicting the details of the configuration of the controlling circuit 12. Namely, the control signal (4) shown in FIG. 1 actually includes various types of control signals (11), (12), (13), and (14) shown in FIG. 2. The control clocks (1) and (3), and the test clock (2), which are shown in FIG. 1, are also identical in FIG. 2, and denoted with the same reference numerals.

As also described in FIG. 1, in the RAM macro 10 according to this preferred embodiment, the timing generating circuit 13 initially generates the timing signal (control clock (1))

generated from the rising edge of the clock CLK, and the timing signal (test clock (2)) generated from the falling edge of the clock CLK based on the clock CLK and the test signal TIM_CTL, which are externally input, and outputs the generated signals to the testing circuit 14. The test signal TIM_CTL is intended to enable the delay amount for generating the control clock (1) to be externally and arbitrarily set/changed. If the delay amount is set to a fixed value, this signal is not required. Moreover, the above expression of a "signal generated from the rising edge of the clock CLK" means a "signal generated by delaying the phase of the clock CLK by a predetermined amount". Accordingly, the rising timing of the control clock (1) is the timing delayed by the delay amount from the rising timing of the clock CLK.

The testing circuit 14 generates/outputs the various types of control signals (11), (12), (13), and (14) based on the control clock (1), the test clock (2), and externally input control signals WE and RST, and externally input test signals (TEST [0] to [2]). At this time, the operation timings of the various types of control signals (11), (12), (13), and (14) are based on either of the control clock (1) and the test clock (2). Which of the clocks the various types of control signals operate based on is determined depending on the values of the test signal (TEST [0] to [2]).

In this way, the RAM macro 10 can be evaluated by changing the operation timings of the circuits (22), (23), (24), and (25) within the controlling circuit 12 according to the control signals (11), (12), (13), and (14), or by further changing the margins of timings of operations of the RAM macro 10.

If all of the various types of control signals (11), (12) (13), and (14) are generated based on the test clock (2), operations within the RAM macro 10 are similar to those in the conventional technology. With the conventional technology, the operation timings of all of the control signals (11), (12), (13), and (14) are determined based on the falling timing of the clock CLK, and the end timings of periods such as write, read, PC periods, etc. to be described later are determined based on the operation timings. Also the start timings of these periods are determined based on the rising timing of the control clock (3), namely, the clock CLK similar to the conventional technology.

Accordingly, an operation based on the test clock (2) is determined by the frequency of the clock CLK (namely, the operation depends on the frequency of the clock CLK). For example, if the frequency of the clock CLK increases, both of the write and the read periods become short. In the meantime, if the control clock (1) is used, an operation that does not depend on the frequency of the clock CLK can be performed. This will be described in detail later.

The timing generating circuit 13 and the testing circuit 14 are altogether referred to as a test timing generating circuit 30 as shown in FIG. 2. FIG. 3 exemplifies the details of the configuration of the test timing generating circuit 30. The test timing generating circuit 30 is principally intended for a test as its name stands for. However, since this circuit is not limited to a test, it may be referred to simply as a timing generating circuit.

In FIG. 2, the controlling circuit 12 is composed of blocks such as a decoder circuit 21, a row selecting circuit 22, a PC circuit 23, a column selecting circuit 24, and a read/write circuit 25. Because the controlling circuit 12 itself has an existing configuration as described above, these constituent elements are not particularly described in detail, and only portions related to the characteristics of the present invention are briefly described. A storage element array 40 is an example of the storing circuit 11 shown in FIG. 1.

The decoder circuit 21 respectively outputs a row selection signal (16) and a column selection signal (15) according to an externally input address to the row selecting circuit 22 and the column selecting circuit 24 at a timing according to the control clock (3). The decoder circuit 21 is reset by the control signal (11) (RST signal). However, this is not especially important in this preferred embodiment.

The row selecting circuit 22 is a circuit for selecting a word line on the side of rows in the storage element array 40, whereas the column selecting circuit 24 is a circuit for selecting a bit line pair on the side of columns in the storage element array 40. The row selecting circuit 22 and the column selecting circuit 24 respectively select a word line and a bit line pair according to the address (signals WL and CSWn of the selected word line and bit line pair become valid). Thereafter, the signal WL remains valid until it is reset by the control signal (12) (WL_RST signal), whereas the signal CSWn remains valid until it is reset by the control signal (13) (CSW_BPCn signal). The read/write circuit 25 performs a write operation to the storage element array 40 if the control signal WE is valid ('H'). Its operation period is valid while both of the signals WL and CSWn are valid (this period is hereinafter referred to as a write period). Additionally, the read/write circuit 25 performs a read operation from the storage element array 40 if the control signal WE is invalid ('L'). Its operation period (read period) is valid from when both of the signals WL and CSWn become valid until when either of the signals becomes invalid or when "read AMP enable" becomes valid. To the read/write circuit 25, the externally input control signal WE, and the control signal (14) output from the testing circuit 14 are input. If the control signal (14) becomes 'L' when the control signal WE is "L", "read AMP enable" becomes valid (SAE to be described later is driven 'H').

As described above, the write and the read periods are determined respectively by the control signals (12) and (13), and the control signals (12) and (13) or (14). A PC (Pre Charge) period in the PC circuit 23 is determined by the control signal (13). The control signal (11) is not directly related to the present invention, and may be excluded to consider the present invention. Accordingly, for example, an expression of "all of control signals" is assumed to mean all of the control signals (12), (13), and (14).

Details of the configuration of the test timing generating circuit 30 shown in FIG. 3 are described next.

Definitions of the signals in FIGS. 3 and 4 are listed below. 'L' and 'H' in the subsequent description indicate low and high levels respectively.

WL (Word Line): row selection timing of the storage element array 40 (valid at 'H')
CSWn (Column Switch): column selection timing of the storage element array 40 (valid at 'L')
SAE (Sense AMP Enable): read AMP enable timing (valid at 'H')
PCn (Pre Charge); initialization timing after read/write operation (valid at 'L')
CLK: externally input clock for controlling the RAM macro 10
RESET: initialization timing signal (valid at 'H')
TIM_CTL[2:0]: delay value selection signal of internal timing
TEST[2:0]: evaluation mode selection signal
WE: write selection signal
CLKP: operation start control clock
RST: RAM macro synchronization clock
WL_RST: word selection initialization timing CSW_BPCn: release of column selection, and bit line initialization timing SAn: read ampl enable fundamental timing The signals with 'n' appended to their names are signals that become valid at 'L'. For example, the normal denotation of SAn is as follows.

$\overline{SA}$

Both TIM_CTL[2:0] and TEST[2:0] are referred to as test signals. Accurately, however, TIM_CTL[2:0] and TEST[2:0] are a delay value selection signal and an evaluation mode selection signal respectively as described above.

The WL signal is a signal that the row selecting circuit 22 shown in FIG. 2 generates based on the control signal (12), etc., and outputs to the storage element array 40 (the signal (11) shown in FIG. 2). The CSWn signal is a signal that the column selecting circuit 24 shown in FIG. 2 generates based on the control signal (13), etc., and outputs to the storage element array 40 (not particularly shown in FIG. 2. Also the SAE and the PCn signals are similar). The SAE signal is a signal that the read/write circuit 25 shown in FIG. 2 generates based on the control signals (14), WE, etc. The PCn signal is a signal that the PC circuit 23 shown in FIG. 2 generates based on the control signal (13), etc.

In the configuration of the test timing generating circuit 30 shown in FIG. 3, a chopper circuit 52 generates a signal CLKP (the above described control signal (3)), which is an operation start timing pulse of the RAM macro 10, from the rising edge of the externally input clock CLK. Actually, a clock clkn that a NOT circuit 51 generates by inverting the clock CLK is input to the chopper circuit 52, which then generates the signal CLKP from the falling edge of the clock clkn.

To a delay pulse generating circuit 54, a clock clk (almost the same as the clock CLK (with a slight phase delay) that a NOT circuit 53 generates by inverting the clock clkn is input, and also the externally input control signal RESET and test signal TIM_CTL [2:0] are input. The above described slight phase delay is not particularly referred to in this specification hereinafter.

The test signal TIM_CTL[2:0] is a signal for externally setting an arbitrary delay value. The delay pulse generating circuit 54 generates the control clock a (the above described control clock (1)), which is a signal generated by delaying the phase of the clock CLK according to the delay value. Since the delay pulse generating circuit 54 itself has an existing configuration, it is not particularly described in detail. For example, a configuration in which a plurality of stages of delay elements are connected in series, and which includes a selector for selectively taking and outputting an output of any of the stages of the delay elements according to the input test signal TIM_CTL[2:0] can be cited as a well-known configuration of the delay pulse generating circuit 54.

The control clock a is input to NAND circuits 57, 68, and 70, and an SA signal generating circuit 90. Operations related to the NAND circuit 57 are initially described. To the NAND circuit 57, the control clock a, and the output of a NOT circuit 56 are input. A signal output from the NOT circuit 56 is a signal that a NOT circuit 55 generates by inverting the clock clk, and that the NOT circuit 56 further inverts and restores to its original state. Namely, the signal output from the NOT circuit 56 is a signal generated by slightly delaying the externally input clock CLK in the four delay elements (NOT circuits 51, 53, 55, and 56). The output of the NAND circuit 57 is inverted by the NOT circuit 58, and results in the RST signal (the control signal (11) shown in FIG. 2). The RST signal remains 'H' while both of the control clock a and the output of the NOT circuit 56 are 'H'. As shown in FIG. 4, etc.,
the RST signal is a signal that makes a transition from 'L' to 'H' at the rising edge of the control clock a, and also makes a transition from 'H' to 'L' at the falling edge of the output signal from the NOT circuit 56.

The rising timing of the control clock a can be externally and arbitrarily set by the test signal TIM_CTL[2:0] if it is, for example, within the range of T1 shown in FIG. 4, etc. This means that the rising timing of the RST signal can be externally and arbitrarily set/changed within the range of T1.

Here, the test timing generating circuit 30 in this preferred embodiment operates in selectively from among a plurality of operation modes according to the test signal (3-bit test signals TEST[0] to [2] here) externally input to the RAM macro 10. Here, assume that there are four operation modes shown in FIGS. 4 to 6 and 9. FIGS. 4, 5, 6, and 9 respectively show operation timings in an operation mode 1 (falling edge function mode), operation timings in an operation mode 2 (write function margin test mode), operation timings in an operation mode 3 (memory cell test mode) and operation timings in an operation mode 4 (rising edge function mode).

The test timing generating circuit 30 operates in the operation mode 1 if the test signals are set to be "TEST [2:0]=LLL", operates in the operation mode 2 if the test signals are set to be "TEST [2:0]=LLH", operates in the operation mode 3 if the test signals are set to be "TEST[2:0]=LHL", or operates in the operation mode 4 if the test signals are set to be "TEST [2:0]=HLL" as shown in FIGS. 4 to 6 and 9. For example, "TEST[2:0]=HLL" means TEST[2]='H', TEST[1]='L', and TEST[0]="L".

The operation modes are described sequentially from the operation mode 1. Prior to their explanation, how the outputs b, c, d, and e of the logic elements 59 to 67 shown in FIG. 3 vary depending on the settings of TEST [2:0] is briefly described.

Initially, in the case of the operation mode 1 (falling edge function mode), the test signals are set to be "TEST[2:0]= LLL". Therefore, all of TEST [0] to [2] shown in FIG. 3 are 'L', and both of the signals b and c result in 'L' if the control signal WE is 'L'. Namely, since both of two inputs of the NAND circuit 59 are 'L', its output results in 'H'. Additionally, the output of the NOT circuit 63 results in 'H'. Consequently, the output (signal b) of the NAND circuit 60 to which the outputs of the NAND circuit 59 and the NOT circuit 63 are input results in 'L'. Additionally, since both of two inputs of the NOR circuit 61 are 'L', its output results in 'H'. Consequently, the output of the NAND circuit 62 to which the output 'H' of the NOR circuit 61 and the output 'H' of the NAND circuit 59 are input results in 'L'.

Both of the outputs of the NOT circuits 63 and 64 to which the signals b and c are respectively input result in 'H', and are respectively input to the NAND circuits 66 and 67. To the NAND circuits 66 and 67, the output of the NOT circuit 65, namely, the inversion signal of the clock clkn is input. Accordingly, the output signals d and e of the NAND circuits 66 and 67 make a transition from 'L' to 'H' at the rising edge of the clock clkn as shown in FIG. 4 (the output signals d and e are driven 'H' if the clock clkn is 'H', and driven 'L' it the clock clkn is 'L').

Also if the control signal WE becomes valid ('H'), the output of the NAND circuit 59 is 'H'—Therefore, the operation is the same as that performed when the control signal WE is 'L'.

In the case of the operation mode 2 (write function margin test mode), the test signals are set to be "TEST[2:0]=LLH". Therefore, TEST[0] shown in FIG. 3 is 'H', TEST[1] and [2] shown in FIG. 3 are 'L'. Accordingly, the outputs of the NOR circuit 61 and the NOT circuit 63 are identical to those in the operation mode 1 (both are always 'H'). The output of the NAND circuit 59 is 'H' if the control signal WE is 'L', and 'L' if WE is 'H'. Accordingly, the signals b and c make a transition from 'L' to 'H' at the rising edge of the control signal WE, and also makes a transition from 'H' to 'L' at the falling edge of the signal WE. If the signals b and c are 'H', the signals d and e are driven 'H' regardless of the clock clkn. Therefore, the signal d makes a transition from 'L' to 'H' at the rising edge of the signal b, and the signal e makes a transition from 'L' to 'H' at the falling edge of the signal c. Namely, the signals d and e are driven 'H' on the write cycle. In the meantime, if the control signal WE is 'L' (on the read cycle), the signals b and c are always 'L' (similar to the case shown in FIG. 4). Therefore, both of the signals d and e make a transition from 'L' to 'H' at the rising edge of the clock clkn, and also make a transition from 'H' to 'L' at the falling edge of the clock clkn.

In the case of the operation mode 3 (memory cell test mode), the test signals are set to be "TEST[2:0]=LHL". Therefore, TEST[1] shown in FIG. 3 is 'H', TEST[0] and [2] shown in FIG. 3 are 'L'. In this case, since the output of the NOR circuit 61 results in 'L', the output signal c of the NAND circuit 62 always results in 'H'. Accordingly, the output signal e of the NAND circuit 67 always results in 'H' Additionally, the output of the NAND circuit 59 always results in 'H' (namely, the output is not changed by the control signal WE). Therefore, the output signal b of the NAND circuit 60 always results in 'L'. Accordingly, the output signal d of the NAND circuit 66 changes in synchronization with the clock clkn, and makes a transition from 'L' to 'H' at the rising edge of the clock clkn (see FIG. 6).

Lastly, in the case of the operation mode 4 (rising edge function mode), the test signals are set to be "TEST[2:0]= HLL". Therefore, TEST[2] shown in FIG. 3 is 'H', and TEST [0] and [1] shown in FIG. 3 are 'L'. In this case, the outputs of the NOR circuit 61 and the NOT circuit 63 result in 'L', and the output of the NAND circuit 59 always results in 'H'. Accordingly, the signals b and c always result in 'H'. Consequently, an inversion signal 'L' of the signals b and c is input to one of the inputs of the NAND circuits 66 and 67. Therefore, the output signals d and e of the NAND circuits 66 and 67 always result in 'H' regardless of the clock clkn.

Operations of the SA signal generating circuit 90 respectively in the operation modes are described here.

As shown in FIG. 3, the clock a (control clock (1)), the clock clkn (test clock (2)), the signal c, and the RESET signal are input to the SA signal generating circuit 90.

A configuration and operations related to the RESET signal are not particularly referred to hereinafter. After a reset is initially made, the RESET signal remains 'L' (namely, while a test is running) until the next reset is made. Therefore, in the SA signal generating circuit 90, the RESET signal is inverted by a NOT circuit 71, and makes a transition to 'H'. Then, the signal is input to the gate of a p-channel MOS transistor 78. Accordingly, the p-channel MOS transistor 78 remains in an OFF state while the test is running. If the clock clkn input to the gate of a p-channel MOS transistor 77 is driven 'L' when the p-channel MOS transistor 78 is in an ON state at the time of a reset, namely, when the RESET signal is driven 'H', both of the p-channel MOS transistors 77 and 78 are turned on. As a result, a signal f is initialized ('H').

Additionally, an input to each transistor is an input made to a corresponding gate. Therefore, an expression of "input to a gate" is not used hereinafter. Moreover, for sources and drains, all of the sources of p-channel MOS transistors are connected to a power supply V (on the side of the power supply V), and all of the sources of n-channel MOS transistors are connected to a ground (the side of the ground). This is not described hereinafter.

In the configuration composed of the p-channel MOS transistor 79, the n-channel MOS transistors 80 and 81, and the NOT circuits 82 and 83 within the SA signal generating circuit 90 shown in FIG. 3, the signal f is fundamentally output unchanged as a signal SAn (although it has a slight delay) by the NOT circuits 82 and 83. Therefore, generation of the signal SAn from the signal f by these circuits is not particularly referred to hereinafter, and the description is provided up to the generation of the signal f. The p-channel MOS transistor 79, and the n-channel MOS transistors 80 and 81 are a configuration for holding the value of the signal f. For example, if the signal f makes a transition from 'L' to 'H', the output of the NOT circuit 82 makes a transition from 'H' to 'L'. Since the output is also input to the p-channel MOS transistor 79 and the n-channel MOS transistor 80, the p-channel MOS transistor 79 is turned from OFF to ON, whereas the n-channel MOS transistor 80 is turned from ON to OFF. As a result, the signal f holds the same voltage level as the voltage V, namely, the state of 'H'. If the signal f makes a transition from 'H' to 'L', the signal f holds the same voltage level as the ground, namely, the state of 'L'.

In a circuit related to the generation of the signal f in the SA signal generating circuit 90, four transistors such as p-channel MOS transistors 73 and 74, and n-channel MOS transistors 75 and 76 are connected in series, and fundamentally, the signal f is driven 'H' if both of the p-channel MOS transistors 73 and 74 are ON, and driven 'L' if both of the n-channel MOS transistors 75 and 76 are ON as shown in FIG. 3. However, since an n-channel MOS transistor 72 is provided in parallel to the n-channel MOS transistor 76, the signal f is driven 'L' also if both of the n-channel MOS transistors 75 and 72 are ON.

Additionally, the clock clkn (test clock (2)) is input to both of the p-channel MOS transistor 73 and the n-channel MOS transistor 76, the clock a (control clock (1)) is input to both of the p-channel MOS transistor 74 and the n-channel MOS transistor 75, and the signal c is input to the n-channel MOS transistor 72.

Based on the above description, timing changes of the signal f in the operation modes are described below.

The case of a write cycle in the operation mode 1 is initially described.

The signal c remains 'L' in the operation model. Therefore, the n-channel MOS transistor 72 is always OFF. If the clock a (control clock (1)) makes a transition to 'H' in FIG. 4, the p-channel MOS transistor 74 is turned off, and the n-channel MOS transistor 75 is turned on. If the clock clkn (test clock (2)) rises in this state, the n-channel MOS transistor 76 is turned on. As a result, both of the n-channel MOS transistors 75 and 76 are turned on. Therefore, the signal f is driven 'L' by the ground. Thereafter, if both of the clocks a and clkn are driven 'L', both of the p-channel MOS transistors 73 and 74 are turned on. As a result, the signal f is driven 'H' by the power supply V.

In the operation mode 1, the same operation as that on the write cycle is performed also on the read cycle. However, if the SAn signal is driven 'L' when the signal f is driven 'L', the SAE signal is driven 'H' (becomes valid), which validates "read AMP enable" on the read cycle as shown in FIG. 4.

The case of the operation mode 2 is described next.

Figure 5:
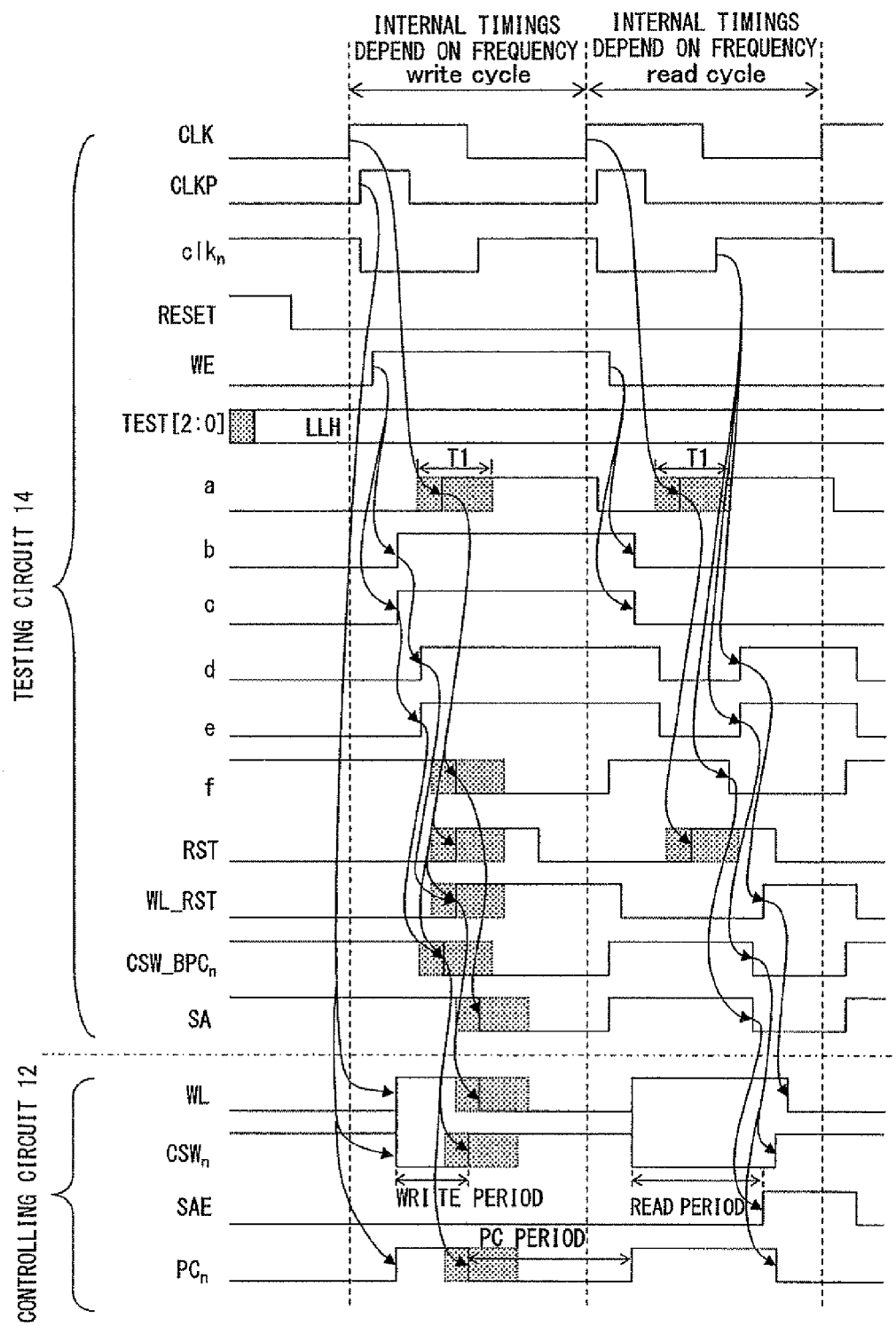
FIG. 5 is an operation timing diagram in an operation mode 2 (write function margin test mode)

As shown in FIG. 5, the signal c is driven 'H' when the write selection signal WE is driven 'H' on the write cycle in the operation mode 2. Therefore, the n-channel MOS transistor 72 is turned on. Accordingly, if the n-channel MOS transistor 75 is turned on when the clock a is driven 'H' even before the clock clkn is driven 'H', the signal f is driven 'L' by the ground as shown in FIG. 5. In the meantime, since the signal c is driven 'L' by the signal WE on the read cycle, the n-channel MOS transistor 72 is turned off as shown in FIG. 5. Accordingly, even if the n-channel MOS transistor 75 is turned on when the clock a is driven 'H', the clock clkn is 'L' at this time point as shown in this figure. Therefore, the n-channel MOS transistor 76 is in the OFF state. If the clock clkn is driven 'H' thereafter, both of the n-channel MOS transistors 75 and 76 are turned on. As a result, the signal f is driven 'L' by the ground.

As described above, the SAn signal makes a transition from 'H' to 'L' at the rising timing of the test clock (2) when the signal c is 'L', and also makes a transition from 'H' to 'L' at the rising timing of the control clock (1) when the signal c is 'H'. The same also applies to the cases of the operation modes 3 and 4. Therefore, this is not described in these operation modes.

Initially, operations of the test timing generating circuit 30 in the operation mode 1 (falling edge function mode) are described below with reference to FIGS. 3 and 4.

In the operation mode 1, operations within the RAM macro 10 depend on the frequency of the clock CLK.

The RST signal (control signal (11) shown in FIG. 2) shown in FIG. 3 is initially described. The RST signal is a signal that the NOT circuit 58 generates by inverting the output of the NAND circuit 57. To the NAND circuit 57, the clock a (control clock (1)), and the output of the NOT circuit 56 (a delay signal of the clock CLK) are input. As a result, the RST signal makes a transition from 'L' to 'H' at the rising edge of the clock a as shown in FIG. 4. As described above, the rising timing of the clock a is adjusted with the test signal TIM_CTL[2:0]. This means that the rising Liming of the RST signal can be adjusted with the test signal TIM_CTL[2:0]. The operation of the RST signal is the same in all of the modes. Therefore, this is not particularly referred to in the subsequent description of the other modes.

In the operation mode 1, the signals b and c remain 'L' as described above. Therefore, the operation timings of the signals d and e are timings synchronous with the clock clkn that is the test clock (2). Also the WL-RST signal and the CSW_BPCn signal result in timings synchronous with the clock clkn as shown in FIG. 4. Namely, the WL_RST signal (control signal (12)) is a signal that the NOT circuit 69 generates by inverting the output of the NAND circuit 68 to which the clock a and the signal d are input. Accordingly, the WL_RST signal is driven 'H' if both of the clock a and the signal d are 'H', and makes a transition from 'L' to 'H' at the rising edge of the signal d as shown in FIG. 4. The CSW_BPCn signal (control signal (13)) is the output signal of the NAND circuit 70 to which the clock a and the signal e are input. Accordingly, the CSW_BPCn signal is driven 'H' if both of the clock a and the signal e are 'H', and makes a transition from 'H' to 'L' at the rising edge of the signal e as shown in FIG. 4.

The signal c is also input to the gate of the n-channel MOS transistor 72, and remains 'L' in the operation mode 1 as described above. Therefore, also the operation timing of the signal f shown in FIG. 3 results in a timing synchronous with the clock clkn that is the test clock (2), and makes a transition from 'H' to 'L' at the rising edge of the clock clkn as shown in FIG. 4. Accordingly, also the SAn signal that is the output of the NOT circuit 83 shown in FIG. 3 results in a timing synchronous with the clock clkn as shown in FIG. 4 (the SAn signal makes a transition from 'H' to 'L' at the falling edge of the signal f).

The operations of the controlling circuit 12 are shown on the bottom side of FIG. 4 according to the various types of control signals ((11) to (14)) output from the test timing generating circuit 30 as described above. Namely, the definitions of the signals WL, CSWn, SAE, and PCn shown on the bottom side of FIG. 4 are listed earlier, and both of the WL and the CSWn signals that are the row and the column selection timing signals of the storage element array 40 become valid at the rising edge of CLKP that is the control signal (3) as shown in FIG. 4 (WL becomes valid at 'H', and CSWn becomes valid at 'L' as described above), and PCn becomes invalid at the rising edge of CLKP. The operations themselves are nearly similar to those in the conventional technology, and common to all of the modes.

As shown in FIG. 4, the WL signal remains valid until it becomes invalid at the rising edge of the WL_RST signal, and the CSWn signal remains valid until it becomes invalid at the falling edge of the CSW_BPCn signal. The rising and the falling timings of the WL_RST signal and the CSW_BPCn signal are determined by the rising timing of the test clock (2) (clock clkn). Therefore, a period during which both of the WL and CSWn signals remain valid (write period shown in FIG. 4) when WE is valid is a period according to the frequency of the clock clkn. Since the frequency of the clock clkn is equal to that of the external clock CLK, the length of the write period depends on the frequency of the external clock CLK after all. The same also applies to the operation performed on the read cycle (when WE is invalid). Namely, as shown in FIG. 4, the read period is a period from when both of WL and CSWn become valid at the rising edge of CLKP until when SAE becomes valid ('H'). Since SAE becomes valid at the falling edge of SAn when WE is invalid, SAn operates at the timing of the clock clkn as described above. Therefore, also the length of the read period depends on the frequency of the external clock CLK.

Additionally, the PCn signal becomes valid at the falling edged of the CSW_BPCn signal. Therefore, also the length of the period during which the PCn signal remains valid (the PC period shown in this figure) depends on the frequency of the external clock CLK.

In FIG. 4, a phase difference between the clock CLK and the control clock (1) is smaller than that between the clock CLK and the test clock (2). Inversely, however, the latter may be made smaller than the former (the phase difference between the clock CLK and the control clock (1) may be made larger).

As described above, if the operation mode 1 (falling edge function mode) is set, the internal operation timings vary depending on the frequency of the externally input clock CLK. Therefore, an evaluation of an operation margin of the RAM macro according to the frequency of the clock CLK can be made. If the RAM macro 10 according to this preferred embodiment is included as a cache memory of an LSI, etc., the logic of the entire LSI can be verified by setting to the operation mode 1 when the RAM macro 10 does not operate in a high-frequency band due to some problem, and by decreasing the frequency of the externally input clock CLK to operate the RAM in a frequency band in which the RAM macro 10 can operate. The point is that switching can be easily made to the operation mode 1 by an external setting.

Next, the operation mode 2 (write function margin test mode) is described below.

As shown in FIG. 5, in the operation mode 2, operation timings within the RAN macro 10 do not depend on the frequency of the external clock CLK on the write cycle, but depend on the frequency of the external clock CLK on the read cycle.

Namely, as described above, the signals b and c are driven 'H' on the write cycle, and driven 'L' on the read cycle in the operation mode 2. Therefore, the operation performed on the read cycle in the operation mode 2 is the same as that performed on the read cycle in the operation mode 1 as shown in FIG. 5. Accordingly, in the operation mode 2, the operation of the RAM macro 10 depends on the frequency of the external clock CLK on the read cycle.

In the meantime, all of the signals b, c, d, and e are 'H' on the write cycle. Therefore, the WL_RST signal is driven 'L' if the clock a that is the control clock (1) is 'L', and driven 'H' if the clock a is 'H'. Similarly, the CSW_BPCn signal is driven 'H' if the clock a is 'L', and driven 'L' if the clock a is 'H'. As described in the operation mode 1, the length of the write period is determined by the rising timing of the WL_RST signal, and the falling timing of the CSW-BPCn signal. Namely, the length of the write period is determined by the rising timing of the clock a.

Additionally, as described in the operation mode 1, the length of the PC period is determined by the falling timing of the CSW_BPCn signal. Therefore, also the length of the PC period is determined by the rising timing of the clock a.

Accordingly, the operation of the RAM macro 10 does not depend on the frequency of the external clock CLK on the write cycle.

As mentioned above, the rising timing of the clock a can be externally and arbitrarily set/changed with the externally input test signal TIM_CTL[2:0] if it is within the range of T1 shown in FIG. 5. Therefore, the lengths of the write and the PC periods can be externally and arbitrarily set/changed.

As described above, during the write operation period, the internal operation timings can be changed with the setting value of TIM_CTL [2:0] regardless of the frequency of the clock CLK if the operation mode 2 (write function margin test mode) is set. In the meantime, during the read operation period, the internal operation timings can be changed according to the frequency of the clock CLK. Accordingly, either of the operation timings of the write and the read operations can be made stricter (the period can be shortened), and the other operation timing can be made loose (the period can be extended). Also the degree of strictness can be easily changed. Accordingly, whether a fault is caused by either a read or a write operation can be identified by evaluating an operation margin of the operation the timing of which is made strict.

In the example shown in FIG. 5, the operation timing of the write operation is stricter. The write period is extended by increasing the frequency of the clock CLK to shorten the read period, and by delaying the rising timing of the clock a with the setting of TIM_CTL[2:0], whereby the operation timing of the read operation can be made stricter.

In this way, an evaluation can be made by making either of the operation timings of the write and the read operations stricter by changing/adjusting either or both of the frequency of the externally input clock CLK and the setting value of TIM_CTL[2:0] in the operation mode 2.

Additionally, in the operation mode 2, the timing margin of the PC period (recovery period after the write operation) can be evaluated by setting the timing of the write operation to the delay side as TIM_CTL setting, and by evaluating the operation of the RAM macro 10 while increasing the operation frequency of the clock CLK in stages (namely, while shortening the PC period in stages).

The operation mode 3 is described next.

Figure 6:
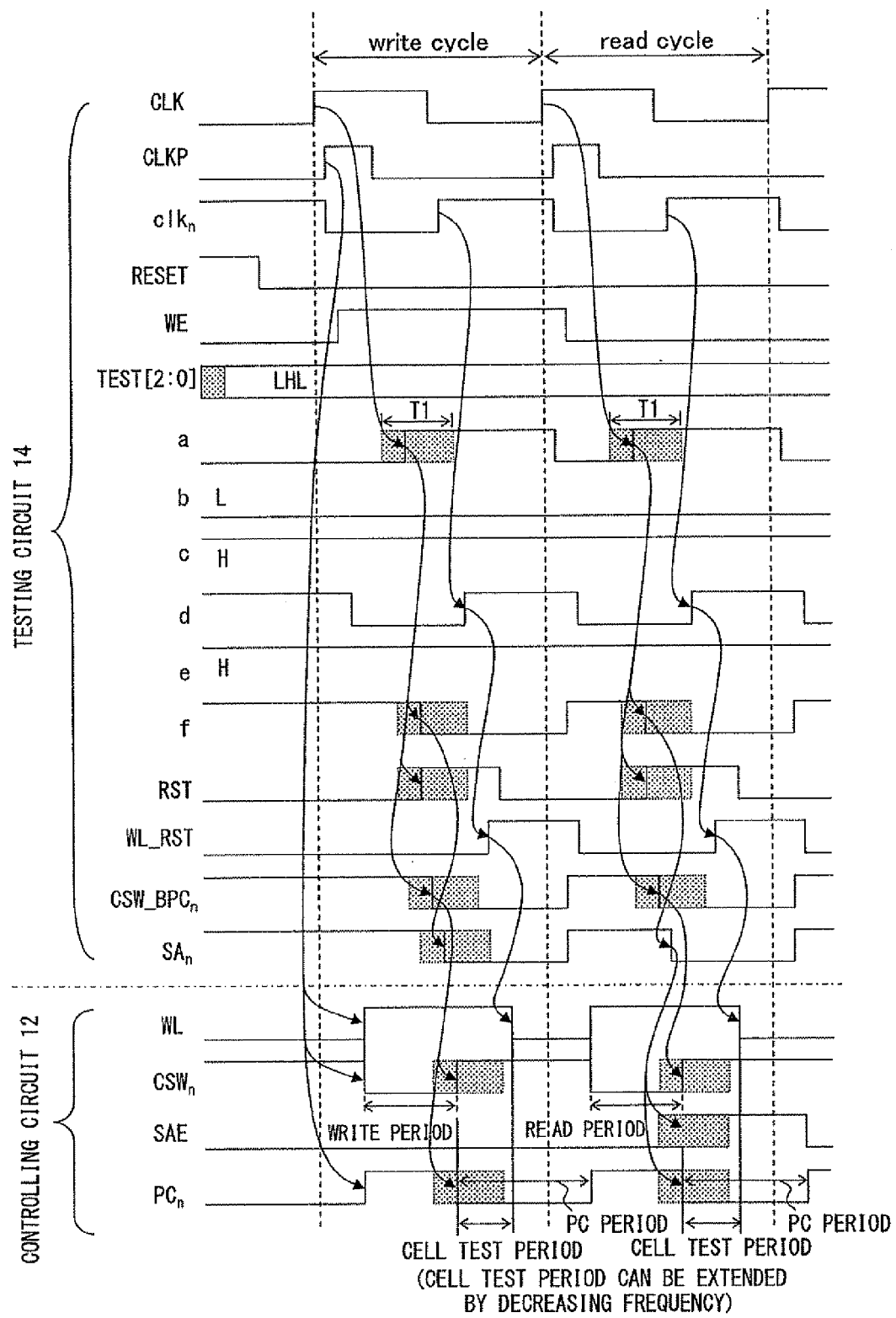
FIG. 6 is an operation timing diagram in an operation mode 3 (memory cell test mode)

If the operation mode 3 (memory cell test mode) is set, the internal state of a memory cell can be made stricter than the normal operation (read/write operation while the system is running) state of the RAM macro. Namely, as shown in FIG. 6, a state where the PC and the WL selection periods overlap (PCn is valid ('L') and the WL is valid ('H'); cell test period) can be made longer than a normal period. The effect of the cell test depends on the frequency of the clock CLK. For example, if the frequency of the clock CLK is decreased, the cell test period can be made longer.

To make the cell test period longer than the normal period by using the circuitry shown in FIG. 3, it is required that the falling (reset) timing of the WL signal is determined by the test clock (2), and the falling timing of the PCn signal is determined by the control clock (1). In the operation mode 1, both of the falling timings of the WL signal and the PCn signal are determined by the test clock (2) on both of the write and the read cycles as shown in FIG. 4. In the operation mode 2, as shown in FIG. 5, both of the falling timings of the WL signal and the PCn signal are determined by the control clock (1) on the write cycle, and these falling timings are determined by the test clock (2) on the read cycle.

As described above, in the operation mode 3, the signal c remains 'H', and also the signal e remains 'H'. As a result, the CSW_BPCn signal that is the output of the NAND circuit 70 to which the clock a and the signal e are input is driven 'L' if the control clock (1) (clock a) is driven 'H'. The PCn signal makes a transition from 'H' to 'L' at the falling edge of the CSW_BPCn signal on the write cycle as described above. The cell test period starts at the timing of this transition. In the meantime, the cell test period starts at the falling edge of the SAn signal on the read cycle as described above. Since the signal c remains 'H' in the operation mode 3, the falling timing of the SAn signal is determined by the control clock (1).

In this way, the falling timing of the PCn signal is determined by the control clock (1) (clock a) on both of the write and the read cycles.

In the meantime, the signal b remains 'L' in the operation mode 3 as described above. Accordingly, the signal d changes in synchronization with the clock clkn, and makes a transition from 'H' to 'L' at the falling edge of the clock clkn. Therefore, the WL-RST signal that is the inversion signal of the output of the NAND circuit 68, to which the clock a and the signal d are input, makes a transition from 'L' to 'H' at the rising edge of the signal d on both of the write and the read cycles. Because the WL signal is reset when the WL_RST signal is driven 'H' as described above, the falling (reset) timing of the WL Signal is determined by the test clock (2) (clock clkn).

As described above, the operation mode 3 is set in the circuitry shown in FIG. 3, whereby the falling (reset) timing of the WL signal is determined by the test clock (2), and the falling timing of the PCn signal is determined by the control clock (1). As a result, the cell test period can be made longer than the normal period. Namely, the internal state of a memory cell can be made stricter than the normal operation (read/write operation while the system is running) state of the RAM macro. As repeatedly described, the rising timing of the clock a (control clock (1)) can be externally and arbitrarily set/changed with the externally input test signal TIM_CTL [2:0] if it is within the predetermined range. Therefore, also the length of the cell test period can be adjusted with some degree of arbitrariness. Accordingly, the characteristic of a memory cell within the RAM macro can be evaluated while changing the length of the cell test period under a condition stricter than a normal condition and with some degree of arbitrariness, thereby increasing the possibility of finding a memory fault.

The cell test period is described in further detail with reference to FIG. 7.

Figure 7:
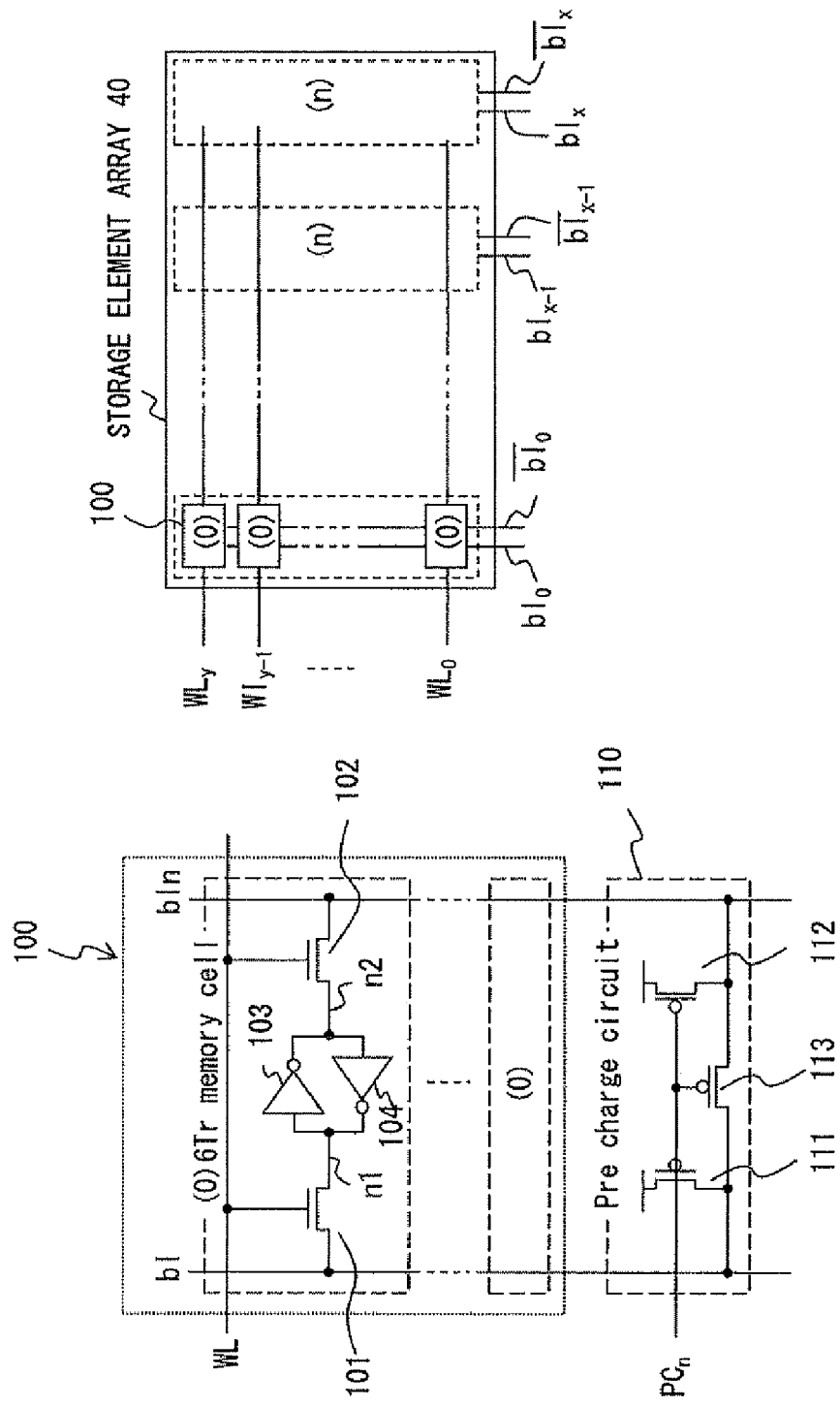
FIG. 7 is a schematic diagram exemplifying a configuration of a storage element array.

FIG. 7 exemplifies a configuration of the storage element array. Since this is a normal configuration, it is not particularly described in detail. In brief, the storage element array 40 is composed of many storage elements 100 as shown in FIG. 7. FIG. 7 shows the configuration of the storage element 100.

As shown in FIG. 7, the storage element 100 is composed of a plurality of memory cells (six memory cells here) 105, each of which is composed of n-channel MOS transistors 101 and 102, and NOT circuits 103 and 104. To the gate of each of the n-channel MOS transistors 101 and 102, the above described WL signal is input.

In the meantime, a PC (Pre Charge) circuit 110 is composed of p-channel MOS transistors 111, 112, and 113 shown in FIG. 7. To the gate of each of these transistors 111, 112, and 113, the above described PCn signal is input.

Figure 8:
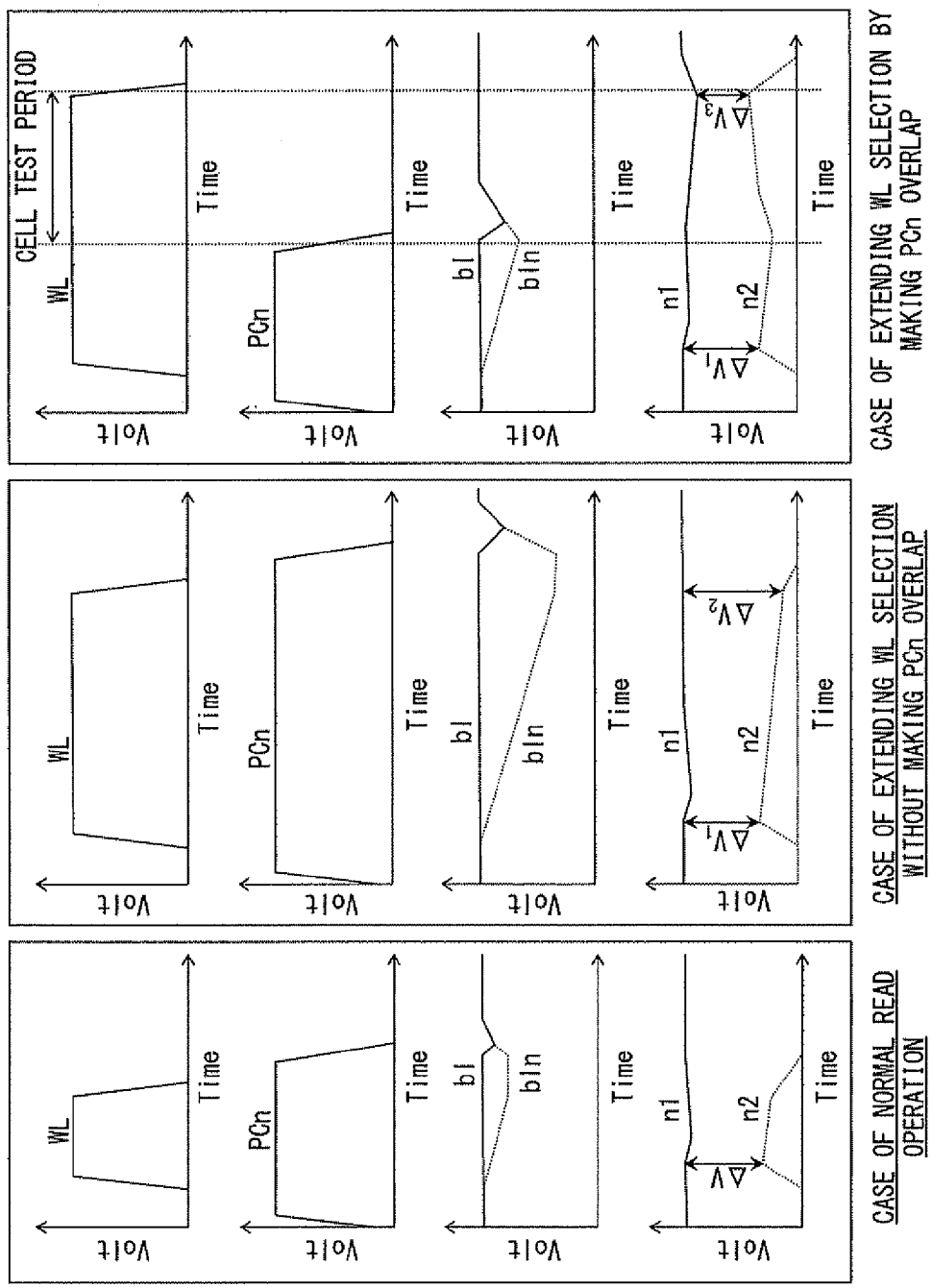
FIGS. 8A to 8C are schematic diagrams showing changes in the voltage levels of bit lines bl and bln according to a PC period and a WL selection period.

The read operation is taken as an example here. For the normal read operation, the WL selection period (the period during which the WL signal remains 'H') is the minimum period required to complete the read/write operation. Therefore, a period (period during which the state of a memory cell becomes nearly unstable) during which a potential difference $\Delta V$ between contacts n1 and n2 is small is short as shown in FIG. 8A. If the degrees of strictness of conditions at the time of the normal and the test operations are identical, duplication occurs in a reference for determining an unstable cell.

Additionally, as shown in FIG. 5B, a potential difference V1 between the contacts n1 and n2 becomes small immediately after WL is selected, if the WL selection period is made longer without making the PC period overlap. Gradually, however, the voltage level of the bit line bln on the side of a negative logic shown in FIG. 8A decreases with the Low level output of the memory cell. This also leads to a decrease in the voltage level of the contact n2. Therefore, a potential difference V2 between the contacts n1 and n2 becomes larger than the potential difference V1. Although the period during which the state of the memory becomes nearly unstable (strict state) is extended by making the WL selection period longer, the degree of strictness becomes loose with the elapse of time. Therefore, it cannot be said that an evaluation and an unstable cell determination are effectively made.

In the meantime, as shown in FIG. 5C, if the period (cell test period) obtained by making the PC period (the period during which PCn remains 'L') and the WL selection period overlap is provided, the voltage levels of the bit line bl and bln are compensated for by the PC circuit 110 in the cell test period. Therefore, the voltage level of the contact n2 gradually increases as shown in FIG. 8C, and a potential difference V3 between the contacts n1 and n2 becomes smaller than the potential difference V1 at the end of the cell test period.

Here, the internal state of the memory cell is held more stably as the potential difference between the contacts n1 and n2 increases. In this stable state, the possibility of inverting data held by the memory cell 105 decreases if the degree of variations in the characteristics of Trs (transistors) configuring the memory cell 105 is low even when the characteristic of the memory cell 105 is deteriorated due to external noise or variations in a manufacturing process. Inversely, if the potential difference between the contacts n1 and n2 is small, the possibility of inverting the data held by the memory cell 105 increases even if the degree of variations in the characteristics of the Trs is low.

As described above, both of the WL selection period and the PC period can be extended in the operation mode 3 in this preferred embodiment. This can implement the state shown in FIG. 8C, whereby a memory cell test can be conducted in a state stricter than a normal state as described above (it becomes easier to detect a memory with a deteriorated characteristic even if the degree of variations in the characteristic of the Trs is low). Moreover, the start timing of the PC period can be externally and arbitrarily changed with the test signal TIM_CTL[2:0] if it is within the above described range of T1 (namely, the cell test period can be adjusted with some degree of arbitrariness). Therefore, the memory cell test can be conducted while variously adjusting/changing test conditions. Alternatively, the cell test period can be also adjusted by changing the frequency of the externally input clock CLK. By decreasing the frequency of the clock CLK, the cell test period can be extended.

The operation mode 4 is described next.

Figure 9:
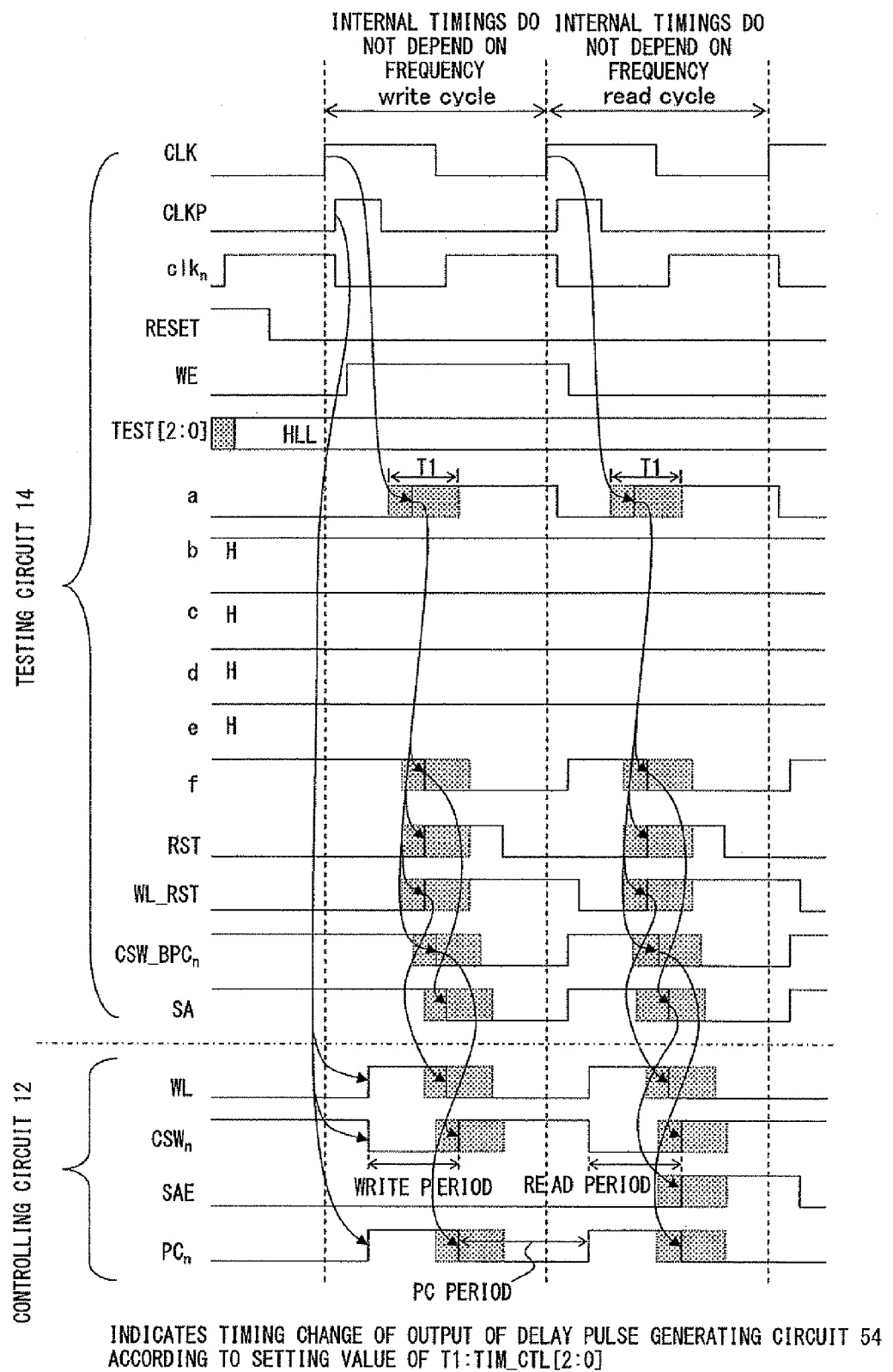
FIG. 9 is an operation timing diagram in an operation mode 4 (rising edge function mode)

As stated earlier, all of the signals b, c, d, and e remain 'H' in the operation mode 4 (a state similar to that on the write cycle in the operation mode 2 shown in FIG. 5). Accordingly, all of the write period, the read period, the PC period, and the read AMP enable timing are determined by the clock a (control clock (1)) as shown in FIG. 9. Namely, the write period, the read period, the PC period, and the read AMP enable timing (referred to as RAM macro internal timings) can be determined without depending on the frequency of the externally input clock CLK. As a matter of course, the rising timing of the clock a can be externally and arbitrarily changed according to the test signal TIM_CTL[2:0] if it is within the above described range of T1 as stated earlier.

Accordingly, if the operation mode 4 (rising edge function mode) is set, the above described RAM macro internal timings can be operated as timings close to the normal operation timings even when the frequency of the externally input clock CLK is lower than the normal frequency (for example, even when the clock CLK with a low frequency is input from an external tester). As a result, an evaluation close to that at the normal operation timings can be made.

Therefore, if the RAM macro 10 according to this preferred embodiment is used, for example, as a cache memory of an LSI chip, etc., and if a peripheral circuit such as PLL, etc. for changing a clock with a low frequency input by a tester to that with a high frequency does not run due to some problem (namely, if the frequency of the externally input clock CLK remains low), the RAM macro can be evaluated in a pseudo manner in a state close to a normal operation state in the operation mode 4.

Not limited to the operation mode 4, if the RAM macro internal timings can be determined without depending on the frequency of the clock CLK on either of the write and the read cycles, they can be changed with the setting of the test signal TIM_CTL [2:0] if it is within the range of T1 as described above. Therefore, a timing margin can be evaluated without changing the frequency of the clock CLK.

By using timing changes made with the setting of the test signal TIM_CTL [2:0], a timing shift caused by variations at the time of a manufacturing process, or the like can be corrected. For example, if the performances of Trs used in a memory cell are manufactured with undesirable variations, a margin of a read/write operation can be improved by setting to the operation mode 4 (rising edge function mode), and by delaying internal timings with the setting of the test signal TIM_CTL [2:0] to the delay side.

Additionally, a margin of only a write operation can be improved without changing the timing of a read operation if the test mode 2 is used.

The present invention is not limited to the configuration for operating a RAM macro by switching a plurality of modes as described above, and may have a configuration fixed to each mode. In this case, neither the test signals TEST[0] to [2] nor the circuitry composed of the gates 59 to 67 shown in FIG. 3 is required. A circuit for simply implementing the signals c, d, and e as the signals shown in FIGS. 4 to 6 and 9 may be provided as an alternative. Especially, the case of the operation mode 4 shown in FIG. 9 is very simple, and all of the signals c, d, and e may be fixed to 'H'. Since also the other modes can be easily implemented, they are not particularly illustrated here.

What is claimed is:

1. A RAM macro having a storing circuit and a controlling circuit accessing the storing circuit, comprising:
   a timing generating circuit for outputting a first control clock generated from a rising edge of an externally input clock, and a second control clock generated from a falling edge of the externally input clock; and
   a testing circuit, which is a circuit for outputting to the controlling circuit various types of control signals for determining various types of timings of accesses made by the controlling circuit to/from the storing circuit, and to which the first and the second control clocks are input and an evaluation mode selection signal is externally input, for determining operation timings of the various types of control signals based on any one of the first and the second control clocks according to the evaluation mode selection signal, wherein
   an operation timing of a control signal synchronous with the first control clock does not depend on a frequency of the externally input clock, and an operation timing of a control signal synchronous with the second control clock depends on the frequency of the externally input clock.

2. The RAM macro according to claim 1, wherein:
   said timing generating circuit comprises a delay pulse generating circuit, to which the externally input clock and an external delay value selection signal are input, and which outputs, as the first control clock, a signal generated by delaying the externally input clock according to the delay value selection signal; and
   the second control clock is an inversion signal of the externally input clock.

3. The RAM macro according to claim 1, wherein all of the operation timings of the various types of control signals are synchronous with the second control clock, if the evaluation mode selection signal indicates a first operation mode.

4. The RAM macro according to claim 1, wherein:
   the various types of control signals include a read/write control signal for determining write and read periods related to a read/write operation performed by the controlling circuit from/to the storing circuit; and
   an operation timing of the read/write control signal is synchronous with the first control clock on a write cycle, and synchronous with the second control clock on a read cycle, if the evaluation mode selection signal indicates a second operation mode.

5. The RAM macro according to claim 1, wherein:
   the various types of control signals include a first control signal that is a signal for invalidating a row selection signal issued from the controlling circuit to the storing circuit, and a second control signal for determining a start timing of a pre charge period; and
   an operation timing of the first control signal is synchronous with the second control clock, and an operation timing of the second control signal is synchronous with the first control clock, if the evaluation mode selection signal indicates a third operation mode.

6. The RAM macro according to claim 1, wherein all of the operation timings of the various types of control signals are synchronous with the first control clock, if the evaluation mode selection signal indicates a fourth operation mode.

7. A test timing generating circuit for outputting to a controlling circuit various types of control signals for determining various types of timings of accesses made by the controlling circuit to/from a storing circuit in a RAM macro having the storing circuit and the controlling circuit accessing the storing circuit, comprising:
   a timing generating circuit for outputting a first control clock generated from a rising edge of an externally input clock, and a second control clock generated from a falling edge of the externally input clock; and
   a testing circuit, which is a circuit for outputting the various types of control signals, and to which the first and the second control clocks are input and an evaluation mode selection signal is externally input, for synchronizing operation timings of the various types of control signals with any one of the first and the second control clocks according to the evaluation mode selection signal, wherein
   an operation timing of a control signal synchronous with the first control clock does not depend on a frequency of the externally input clock, and an operation timing of a control signal synchronous with the second control clock depends on the frequency of the externally input clock.

8. The test timing generating circuit according to claim 7, wherein:
   said timing generating circuit comprises a delay pulse generating circuit, to which the externally input clock and an external delay value selection signal are input, and which outputs, as the first control clock, a signal generated by delaying the externally input clock according to the delay value selection signal; and
   the second control clock is an inversion signal of the externally input clock.

9. The test timing generating circuit according to claim 8, wherein:
   the various types of control signals include a read/write control signal for determining write and read periods related to a read/write operation performed by the controlling circuit from/to the storing circuit; and
   an operation timing of the read/write control signal is synchronous with the first control clock on a write cycle, and synchronous with the second control clock on a read cycle, if the evaluation mode selection signal indicates a second operation mode.

10. The test timing generating circuit according to claim 9, wherein
    any one or both of the write period on the write cycle and the read period on the read cycle are changed by altering anyone or both of the delay value selection signal and the input clock, in the second operation mode.

11. A test timing generating circuit for outputting to a controlling circuit various types of control signals for determining various types of timings of accesses made by the controlling circuit to/from a storing circuit in a RAM macro having the storing circuit and the controlling circuit accessing the storing circuit, comprising:
    a timing generating circuit for outputting a first control clock generated from a rising edge of an externally input clock, and a second control clock generated from a falling edge of the externally input clock; and a testing circuit, which is a circuit for outputting as the various types of control signals at least a read/write control signal for determining write and read periods related to a read/write operation performed by the controlling circuit from/to the storing circuit, for synchronizing an operation timing of the read/write control signal with the first control clock on a write cycle, and for synchronizing an operation timing of the read/write control signal with the second control clock on a read cycle.

* * * * *